(12) United States Patent
Antonyan et al.

(10) Patent No.: US 10,510,393 B2
(45) Date of Patent: Dec. 17, 2019

(54) RESISTIVE MEMORY DEVICE INCLUDING REFERENCE CELL AND OPERATING METHOD THEREOF

(71) Applicant: Samsung Electronics Co., Ltd., Suwon-si, Gyeonggi-do (KR)

(72) Inventors: Artur Antonyan, Suwon-si (KR); Suk-soo Pyo, Hwaseong-si (KR)

(73) Assignee: Samsung Electronics Co., Ltd, Gyeonggi-do (KR)

(*) Notice: Subject to any disclaimer, the term of this patent is extended or adjusted under 35 U.S.C. 154(b) by 0 days.

(21) Appl. No.: 16/118,774

(22) Filed: Aug. 31, 2018

(65) Prior Publication Data
US 2019/0088299 A1     Mar. 21, 2019

(30) Foreign Application Priority Data

Sep. 15, 2017  (KR) .................. 10-2017-0118844
Feb. 20, 2018  (KR) .................. 10-2018-0020007

(51) Int. Cl.
| | | |
|---|---|---|
| G11C 11/00 | (2006.01) | |
| G11C 11/16 | (2006.01) | |
| G11C 13/00 | (2006.01) | |
| H01L 43/08 | (2006.01) | |
| G11C 7/04 | (2006.01) | |
| G11C 7/08 | (2006.01) | |

(52) U.S. Cl.
CPC ............ *G11C 11/1673* (2013.01); *G11C 7/04* (2013.01); *G11C 11/1655* (2013.01); *G11C 11/1657* (2013.01); *G11C 11/1697* (2013.01); *G11C 13/004* (2013.01); *H01L 43/08* (2013.01); *G11C 7/08* (2013.01); *G11C 2013/0054* (2013.01)

(58) Field of Classification Search
CPC ... G11C 11/161; G11C 11/1675; G11C 17/16; G11C 17/165; G11C 2029/4402; G11C 29/70; G11C 11/1655; G11C 11/1657; G11C 11/1673; G11C 11/1697; G11C 13/004; G11C 2013/0054
USPC .... 365/148, 96, 158, 189.05, 196, 203, 207, 365/225.7, 230.06, 189.09, 210.1, 94
See application file for complete search history.

(56) References Cited

U.S. PATENT DOCUMENTS

| | | |
|---|---|---|
| 6,356,161 B1 | 3/2002 | Nolan et al. |
| 6,512,689 B1 | 1/2003 | Naji et al. |
| 7,145,824 B2 | 12/2006 | Bill et al. |
| 7,936,590 B2 | 5/2011 | Park et al. |

(Continued)

FOREIGN PATENT DOCUMENTS

| | | |
|---|---|---|
| JP | 4731219 B2 | 7/2011 |
| JP | 2015-115083 A | 6/2015 |
| KR | 10-2012-0091583 A | 8/2012 |

*Primary Examiner* — Thong Q Le
(74) *Attorney, Agent, or Firm* — Harness, Dickey & Pierce, P.L.C.

(57) ABSTRACT

Provided is a resistive memory device configured to output a value stored in a memory cell in response to a read command, the resistive memory device including a cell array including the memory cell and a reference cell; a reference resistance circuit configured to be electrically connected to the reference cell; an offset current source circuit configured to add or draw an offset current to or from a read current provided to the reference resistance circuit; and a control circuit configured to control the offset current source circuit to compensate for a variation of a resistance of the memory cell.

20 Claims, 10 Drawing Sheets

(56) References Cited

U.S. PATENT DOCUMENTS

| | | | |
|---|---|---|---|
| 8,154,903 | B2 | 4/2012 | Jung et al. |
| 8,194,439 | B2 | 6/2012 | Kim et al. |
| 8,254,195 | B2 | 8/2012 | Rao |
| 8,493,776 | B1 | 7/2013 | Yu et al. |
| 8,509,008 | B2 | 8/2013 | Lee |
| 8,687,412 | B2 | 4/2014 | Chih et al. |
| 8,941,369 | B2 | 1/2015 | Youssefi |
| 9,112,513 | B2 | 8/2015 | Gajda |
| 9,390,779 | B2 | 7/2016 | Jung et al. |
| 9,406,367 | B2 | 8/2016 | Chih et al. |
| 9,455,013 | B2 | 9/2016 | Kim et al. |
| 9,607,676 | B2 | 3/2017 | Abedifard et al. |
| 2006/0227598 | A1* | 10/2006 | Sakimura ............... G11C 11/15 365/158 |
| 2009/0237977 | A1 | 9/2009 | Ramani et al. |
| 2012/0314478 | A1 | 12/2012 | Ha et al. |
| 2016/0265983 | A1 | 9/2016 | Hsu et al. |
| 2017/0062032 | A1 | 3/2017 | Seo et al. |
| 2017/0069397 | A1 | 3/2017 | Andre et al. |

\* cited by examiner

RESISTIVE MEMORY DEVICE INCLUDING REFERENCE CELL AND OPERATING METHOD THEREOF

CROSS-REFERENCE TO RELATED APPLICATIONS

This application claims the benefit of Korean Patent Application Nos. 10-2017-0118844, filed on Sep. 15, 2017 and 10-2018-0020007, filed on Feb. 20, 2018, in the Korean Intellectual Property Office, the disclosures of which are incorporated herein in their entirety by reference.

BACKGROUND

The inventive concepts relate to a resistive memory device, and more particularly to a resistive memory device including a reference cell and a method of operating a resistive memory device.

A resistive memory device may store data in a memory cell that includes a variable resistance element. To detect data stored in a memory cell of a resistive memory device, for example, a read current may be supplied to the memory cell, and a voltage due to the read current and a variable resistive element of the memory cell may be detected.

In memory cells in which specific values are stored, the resistances of variable resistive elements may be scattered, and the scattering may fluctuate due to process voltage temperatures (PVT) or the like. Such a variation of a resistance spread may interfere with accurate reading of values stored in memory cells.

SUMMARY

The inventive concepts provide a resistive memory device and a method of operating the memory device for accurately reading a value stored in a memory cell by compensating for variations in the resistance of the memory cell.

According to an aspect of the inventive concepts, there is provided a resistive memory device configured to output a value stored in a memory cell in response to a read command, the resistive memory device including a cell array including the memory cell and a reference cell; a reference resistance circuit configured to be electrically connected to the reference cell; an offset current source circuit configured to add or draw an offset current to or from a read current provided to the reference resistance circuit; and a control circuit configured to control the offset current source circuit to compensate for a variation of a resistance of the memory cell.

According to another aspect of the inventive concepts, there is provided a resistive memory device configured to output a value stored in a memory cell in response to a read command, the resistive memory device including a cell array including the memory cell through which a first read current passes and a reference cell through which a reference current passes; a current source circuit configured to generate the first read current and the second read current; an offset current source circuit configured to generate the reference current by adding or drawing an offset current to or from the second read current; and a control circuit configured to control the offset current source circuit to compensate for a variation of the resistance of the memory cell.

According to another aspect of the inventive concepts, there is provided a resistive memory device configured to outputs a value stored in a memory cell in response to a read command, the resistive memory device including a cell array including the memory cell through which a first read current passes and a reference cell through which a second read current passes; an offset current source circuit configured to generate a reference current by adding or drawing an offset current to or from the second read current; a reference resistance circuit that is electrically connected to the reference cell and through which the reference current passes; and a control circuit configured to control the offset current source circuit to compensate for a variation of a resistance of the memory cell.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF EXAMPLE EMBODIMENTS

Below, example embodiments of the inventive concepts will be described clearly and in detail with reference to accompanying drawings to such an extent that an ordinary one in the art implements example embodiments of the inventive concepts.

Figure 1:
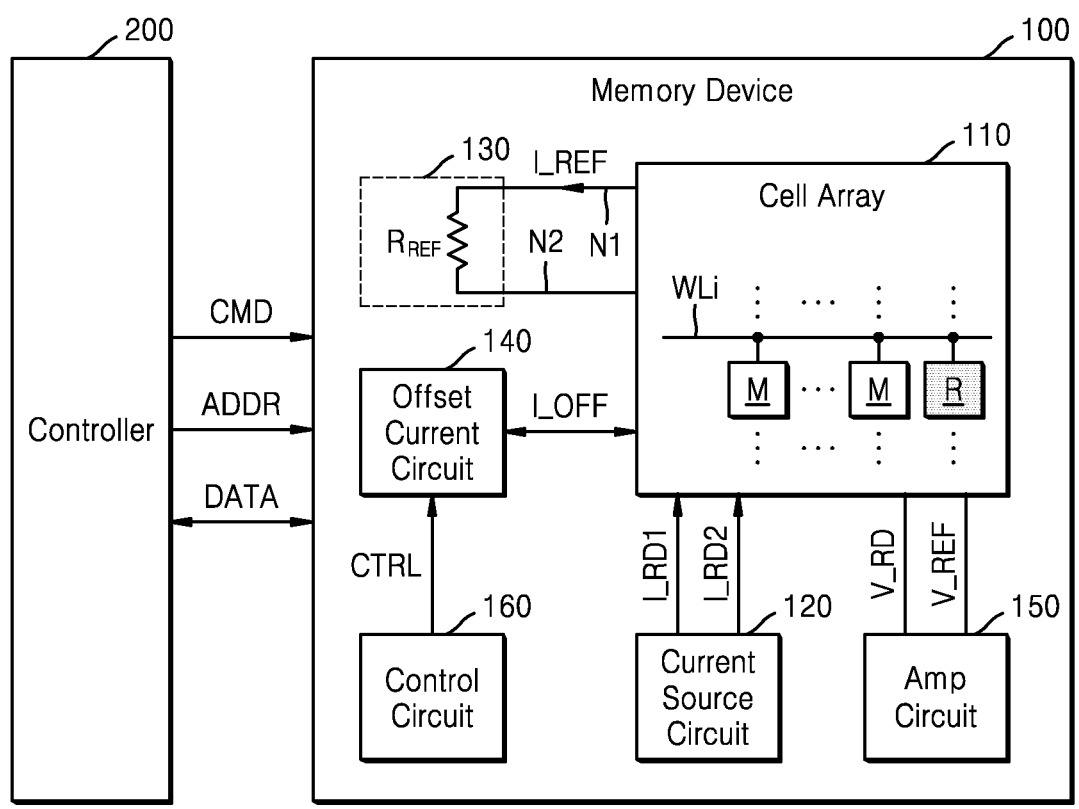
FIG. 1 is a block diagram showing a memory device and a controller according to an example embodiment.

FIG. 1 is a block diagram showing a memory device 100 and a controller 200 according to an example embodiment.

Referring to FIG. 1, the memory device 100 may communicate with the controller 200. The memory device 100 may receive a command CMD like a write command and a read command and an address ADDR from the controller 200 and receive data DATA (that is, data to write) from the controller 200 or transmit data DATA (that is, data to be read) to the controller 200. Although FIG. 1 shows the command CMD, the address ADDR, and the data DATA separately, according to some example embodiments, at least two of the command CMD, the address ADDR, and the data DATA may be transmitted through a same channel As shown in FIG. 1, the memory device 100 may include a cell array 110, a current source circuit 120, a reference resistance circuit 130, an offset current circuit 140, an amplification circuit 150, and/or a control circuit 160.

The cell array 110 may include a plurality of memory cells M. A memory cell M may include a variable resistive element (e.g., MTJ in FIG. 2), and the variable resistive element may have a resistance corresponding to a value stored in the memory cell M. Therefore, the memory device 100 may be referred to as a resistive memory device or a resistive random access memory (ReRAM) device. For example, as an unlimited example, the memory device 100 may include the cell array 110 having a structure like phase change random access memory (PRAM), ferroelectric random access memory (FRAM), or the like or the cell array 110 having a structure having a magnetic random access memory (MRAM) structure like spin-transfer torque magnetic random access memory (STT-MRAM), spin torque transfer magnetization switching RAM (Spin-PRAM), and spin momentum transfer RAM (SMT-RAM). As described below with reference to FIG. 2, example embodiments will be described primarily with reference to MRAM, but example embodiments are not limited thereto.

The cell array 110 may include a reference cell R used to determine a value stored in the memory cell M. For example, as shown in FIG. 1, the cell array 110 may include a plurality of memory cells M and the reference cell R connected in common to a word line WLi, and thus the plurality of memory cells M and the reference cell R connected in common to the word line WLi may be simultaneously selected by the activated word line WLi. Although only one reference cell R is shown in FIG. 1, in some example embodiments, the cell array 110 may include two or more reference cells R connected to the word line WLi. In some example embodiments, the reference cell R may be a shorted cell that does not include a resistive element like a variable resistive element, as described below with reference to FIGS. 4 through 6.

The current source circuit 120 may provide a first read current I_RD1 and a second read current I_RD2 to the cell array 110. For example, in response to a read command, the current source circuit 120 may provide the first read current I_RD1 to the memory cell M and provide at least a part of the second read current I_RD2 to the reference cell R. In some example embodiments, the current source circuit 120 may generate the first read current I_RD1 and the second read current I_RD2 of a same magnitude. Furthermore, in some example embodiments, the current source circuit 120 may adjust the magnitude(s) of the first read current I_RD1 and/or the second read current I_RD2 under the control of the control circuit 160.

In response to a read command, the reference resistance circuit 130 may be electrically connected to the reference cell R and provide a resistance through which a reference current I_REF passes. As described below, the reference current I_REF may be a current generated as an offset current I_OFF is added to or drawn from the second read current I_RD2 generated by the current source circuit 120. For example, as shown in FIG. 1, the reference resistance circuit 130 may provide a resistance having a reference resistance $R_{REF}$ between a first node N1 to which the reference current I_REF is supplied and a second node N2 from which a reference current I_REF is output. Furthermore, in some example embodiments, the reference resistance circuit 130 may adjust the reference resistance $R_{REF}$ under the control of the control circuit 160. The resistance of the reference resistance circuit 130 may have a characteristic different from that of the resistance formed inside the cell array 110 (e.g., MTJ in FIG. 2). For example, the resistance of the reference resistance circuit 130 may have better a characteristic than that of the resistance formed inside the cell array 110. For example, the resistance of the reference resistance circuit 130 may be more insensitive to PVT variations.

The offset current circuit 140 may generate the reference current I_REF by adding or drawing the offset current I_OFF to or from the second read current I_RD2. The offset current circuit 140 may include at least one current source that generates the offset current I_OFF, and the magnitude of the offset current I_OFF may be adjusted according to a control signal CTRL provided from the control circuit 160. As described below, the offset current I_OFF may have a magnitude and a direction corresponding to the variation of a variable resistance element included in the memory cell M. In some example embodiments, the second read current I_RD2 may pass through the reference cell R as described below with reference to FIG. 4 or, in some example embodiments, the reference current I_REF may pass through the reference cell R as described below with reference to FIGS. 5 and 6.

The amplification circuit 150 may receive a read voltage V_RD and a reference voltage V_REF and may determine a value stored in the memory cell M based on the read voltage V_RD and the reference voltage V_REF. For example, the amplification circuit 150 may output a signal corresponding to the value stored in the memory cell M by comparing the read voltage V_RD with the reference voltage V_REF. The read voltage V_RD may include a voltage drop caused as the first read current I_RD1 provided by the current source circuit 120 passes through the memory cell M. Furthermore, the read voltage V_RD may include not only a voltage drop due to the memory cell M, but also a voltage drop caused by a parasitic resistance in a path through which the first read current I_RD1 passes (e.g., a column decoder 170a, a source line SLj, and a bit line BLj).

Figure 4:
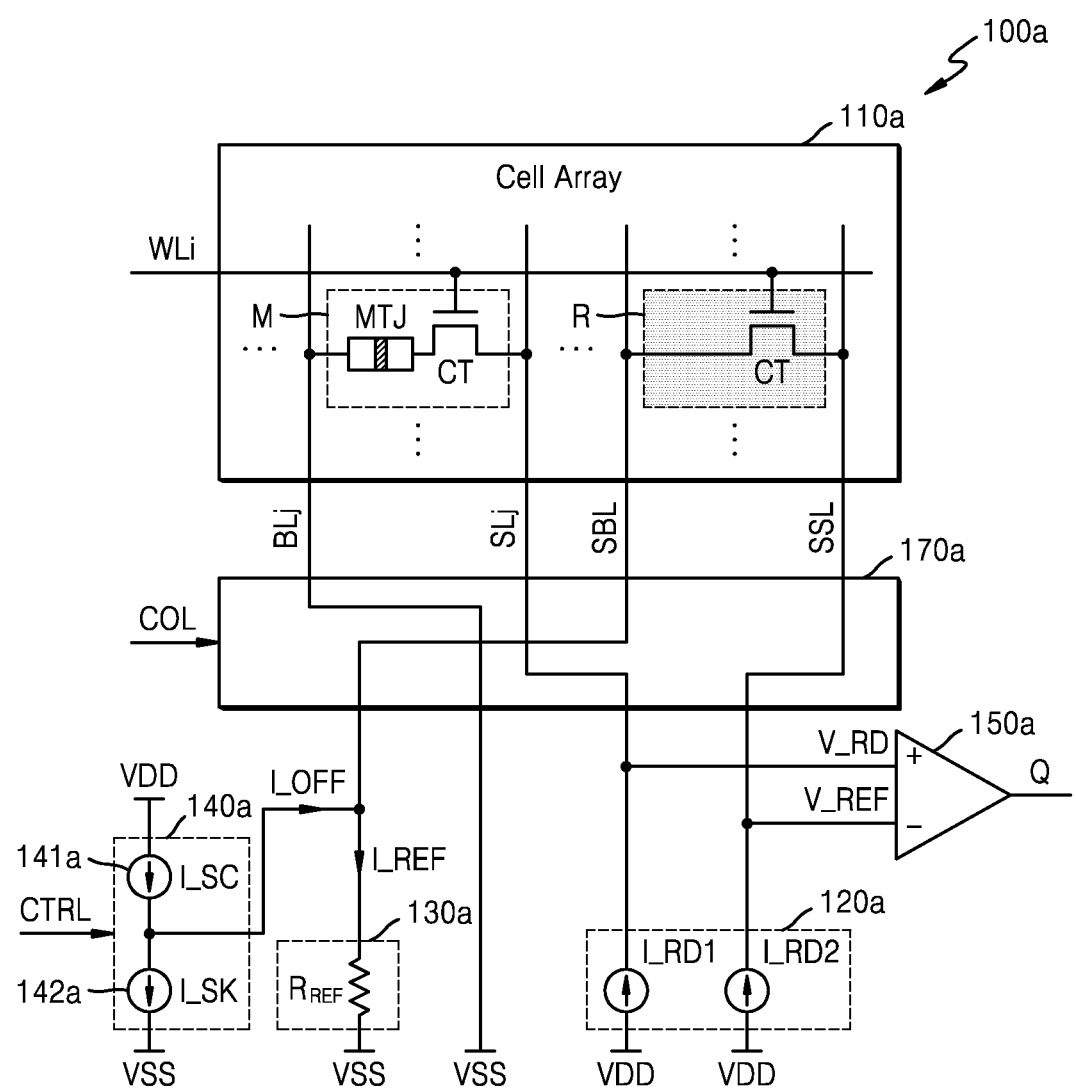
FIG. 4 is a block diagram showing an example of the memory device of FIG. 1 according to an example embodiment.

Similar to the read voltage V_RD, the reference voltage V_REF may include not only a voltage drop caused by the reference cell R, but also a voltage drop caused by a parasitic resistance in a path through which the second read current I_RD2 provided by the current source circuit 120 or the reference current I_REF passes (e.g., the column decoder 170a, a short-circuit source line SSL, and a short-circuit bit line SBL in FIG. 4). The reference voltage V_REF may further include a voltage drop caused by a reference resistance $R_{REF}$ provided by the reference resistance circuit 130. Therefore, the reference voltage V_REF may be adjusted by controlling the reference current I_REF and the reference resistance $R_{REF}$ of the reference resistance circuit 130, and thus criteria for determining a value stored in the memory cell M may be adjusted.

The control circuit 160 may control the offset current circuit 140 through the control signal CTRL. In some example embodiments, the control circuit 160 may generate the control signal CTRL to compensate for variations of the resistance of a variable resistance element included in the memory cell M based on PVT variations or the like. For example, when the variable resistance element included in the memory cell M has a resistance proportional to the temperature, that is, a positive temperature coefficient, the control circuit 160 may reduce the magnitude of the offset current I_OFF drawn from the second read current I_RD2 through the control signal CTRL, such that the reference current I_REF supplied to the reference resistance circuit 130 increases, or increase the magnitude of the offset current I_OFF added to the second read current I_RD2. On the other hand, when the variable resistance element included in the memory cell M has a resistance inversely proportional to the temperature, that is, a negative temperature coefficient, the control circuit 160 may increase the magnitude of the offset current I_OFF drawn from the second read current I_RD2 or reduce the magnitude of the offset current I_OFF added to the second read current I_RD2 through the control signal CTRL, such that the reference current I_REF supplied to the reference resistance circuit 130 decreases.

In some example embodiments, the control circuit 160 may receive information about the offset current I_OFF from the controller 200. For example, the controller 200 may estimate the magnitude of the offset current I_OFF used in an operation for reading the memory device 100 to compensate for process variations of the memory device 100 and provide information about the estimated offset current I_OFF to the memory device 100. The information about the estimated offset current I_OFF may be stored in a non-volatile memory device (e.g., NVM in FIG. 7B) included in the memory device 100, and the control circuit 160 may generate the control signal CTRL according to the information about the estimated offset current I_OFF stored in the non-volatile memory device.

When the reference resistance $R_{REF}$ of the reference resistance circuit 130 is adjusted to compensate for variation of the resistance of the variable resistance element included in the memory cell M due to the PVT variations or the like, the resistance may be quantized due to adjustable limited resistances, and thus the accuracy of the compensation may be deteriorated. In addition, to provide a plurality of adjustable reference resistances, the reference resistance circuit 130 may include a plurality of resistors and switch devices, and thus space consumption and power consumption by the reference resistance circuit 130 may increase. On the other hand, in the case of compensating for a variation of the resistance of the variable resistance element included in the memory cell M through the offset current I_OFF of the offset current circuit 140, a highly accurate compensation may be expected due to the continuous characteristics of the offset current I_OFF based on a simple structure as described below.

Figure 2:
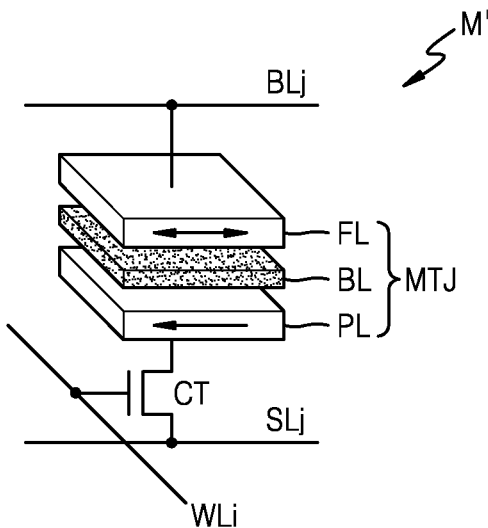
FIG. 2 is a block diagram showing an example of a memory cell of FIG. 1 according to an example embodiment.
Figure 3:
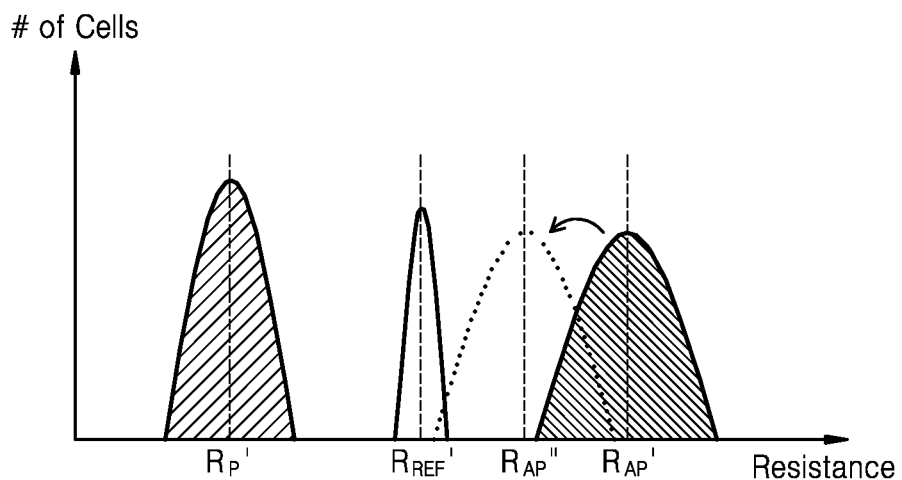
FIG. 3 is a graph showing a scattering of the resistances provided by the memory cell of FIG. 2 according to an example embodiment.

FIG. 2 is a diagram showing an example of the memory cell M of FIG. 1 according to an example embodiment, and FIG. 3 is a graph showing scattering of resistances provided by the memory cell M of FIG. 2 according to an example embodiment. More specifically, FIG. 2 shows a memory cell M' including a magnetic tunnel junction (MTJ) element as a variable resistance element, and FIG. 3 shows scattering of resistances of the variable resistance element MTJ of FIG. 2.

As shown in FIG. 2, the memory cell M' may include the variable resistance element MTJ and a cell transistor CT that are connected to each other in series between the bit line BLj and the source line SLj. In some example embodiments, the variable resistance element MTJ and the cell transistor CT may be connected in the order stated between the bit line BLj and the source line SLj, as shown in FIG. 2 and, in some example embodiments, may be connected to each other in the order of the cell transistor CT and the variable resistance element MTJ between the bit line BLj and the source line SLj, as shown in FIG. 3.

The variable resistance element MTJ may include a free layer FL and a pinned layer PL and may include a barrier layer BL between the free layer FL and the pinned layer PL. As indicated by the arrows in FIG. 2, the magnetization direction of the pinned layer PL may be fixed, whereas the free layer FL may have the same or opposite magnetization direction as the magnetization direction of the pinned layer PL. The variable resistance element MTJ may be referred to as being in a parallel state P when the pinned layer PL and the free layer FL have a same magnetization direction. Meanwhile, when the pinned layer PL and the free layer FL have opposite magnetization directions, the variable resistance element MTJ may be referred to as being in an anti-parallel state AP. In some example embodiments, the variable resistance element MTJ may further include an anti-ferromagnetic layer, such that the pinned layer PL has a fixed magnetization direction.

The variable resistance element MTJ may have a relatively low resistance $R_P$ in the parallel state P and a relatively high resistance $R_{AP}$ in the anti-parallel state AP. In this specification, it is assumed that the memory cell M' stores '0' when the variable resistance element MTJ in the parallel state P has a low resistance $R_P$ and stores '1' when the variable resistance element MTJ in the anti-parallel state AP has a high resistance $R_{AP}$. Furthermore, in this specification, the resistance $R_P$ corresponding to '0' may be referred to as a parallel resistance $R_P$, whereas the resistance $R_{AP}$ corresponding to '1' may be referred to as an anti-parallel resistance $R_{AP}$.

The cell transistor CT may include a gate connected to a word line WLi and a source and a drain connected to the source line SLj and the variable resistance element MTJ. The cell transistor CT may electrically connect or disconnect the variable resistance element MTJ and the source line SLj according to a signal applied to the word line WLi. For example, to write '0' to the memory cell M' in a write operation, the cell transistor CT may be turned ON, and a current from the bit line BLj to the source line SLj may pass through the variable resistance element MTJ and the cell transistor CT. Furthermore, to write '1' to the memory cell M', the cell transistor CT may be turned ON, and a current from the source line SLj to the bit line BLj may pass through the cell transistor CT and the variable resistance element MTJ. In a read operation, the cell transistor CT may be turned ON and the current from the bit line BLj to the source line SLj or the current from the source line SLj to the bit line BLj, that is, the first read current I_RD1, may pass through the cell transistor CT and the variable resistance element MTJ. It is assumed herein that the first read current I_RD1 flows from the source line SLj to the bit line BLj.

Referring to FIG. 3, the resistance of the variable resistance element MTJ may be scattered. For example, as shown in FIG. 3, there may be a scattering of parallel resistances $R_P$ having an average $R_P'$ in memory cells storing '0' and there may be a scattering of antiparallel resistances $R_{AP}$ having an average $R_{AP}'$ or $R_{AP}''$ in memory cells storing '1'. Furthermore, there may also be a scattering of reference resistances $R_{REF}$ having an average $R_{REF}'$ between the scattering of the parallel resistances $R_P$ and the scattering of the antiparallel resistances $R_{AP}$. As shown in FIG. 3, due to the characteristics of the reference resistance circuit 130, the reference resistances $R_{REF}$ may have a relatively good scattering, that is, a relatively low scattering than resistances $R_P$ and $R_{AP}$ of the variable resistance element MTJ. Furthermore, in some example embodiments, as shown in FIG. 3, the antiparallel resistances $R_{AP}$ may have a relatively deteriorated scattering, that is, a relatively high scattering than that of the parallel resistances $R_P$.

In the example of FIG. 3, the antiparallel resistance $R_{AP}$ of the variable resistive element MTJ may decrease as the temperature of the variable resistive element MTJ increases. In addition, such a variation may be more remarkable for the antiparallel resistance $R_{AP}$ than for the parallel resistance $R_P$. For example, as indicated by the arrows in FIG. 3, the scattering of the antiparallel resistances $R_{AP}$ at low temperatures may be shifted to the left as the temperature rises toward the scattering of the antiparallel resistances $R_{AP}$ at high temperatures, and the average of the anti-parallel resistances $R_{AP}$ may be shifted from $R_{AP}'$ to $R_{AP}''$. As a result, a sensing margin for detecting the anti-parallel resistances $R_{AP}$ by using the reference resistance $R_{REF}$ at a high temperature may be reduced and, for example, as indicated by the dotted line in FIG. 3, the scattering of the reference resistances $R_{REF}$ may partially overlap the scattering of the anti-parallel resistances $R_{AP}$.

The scattering of the reference resistances $R_{REF}$ may be shifted to the left at a high temperature to accurately read '1' stored in the memory cell M' even at a high temperature. As described above with reference to FIG. 1, to shift the scattering of the reference resistances $R_{REF}$ to the left at a high temperature, the reference resistance $R_{REF}$ of the reference resistance circuit 130 may decrease, whereas the magnitude of the reference current I_REF may be reduced according to the offset current I_OFF. In other words, since a value stored in the memory cell M' is determined based on the read voltage V_RD and the reference voltage V_REF, the decrease of the reference voltage V_REF due to the decrease of the reference current I_REF may cause a same effect as that of shifting the scattering of the reference resistance $R_{REF}$ to the left. Although FIG. 3 exemplifies a variation of the resistance of the variable resistance element MTJ according to temperatures, other factors causing the variation of the resistance of the variable resistance element MTJ like a process and a supply voltage may also be compensated for by adjusting the reference current I_REF similarly as in the case of the temperature.

Figure 5:
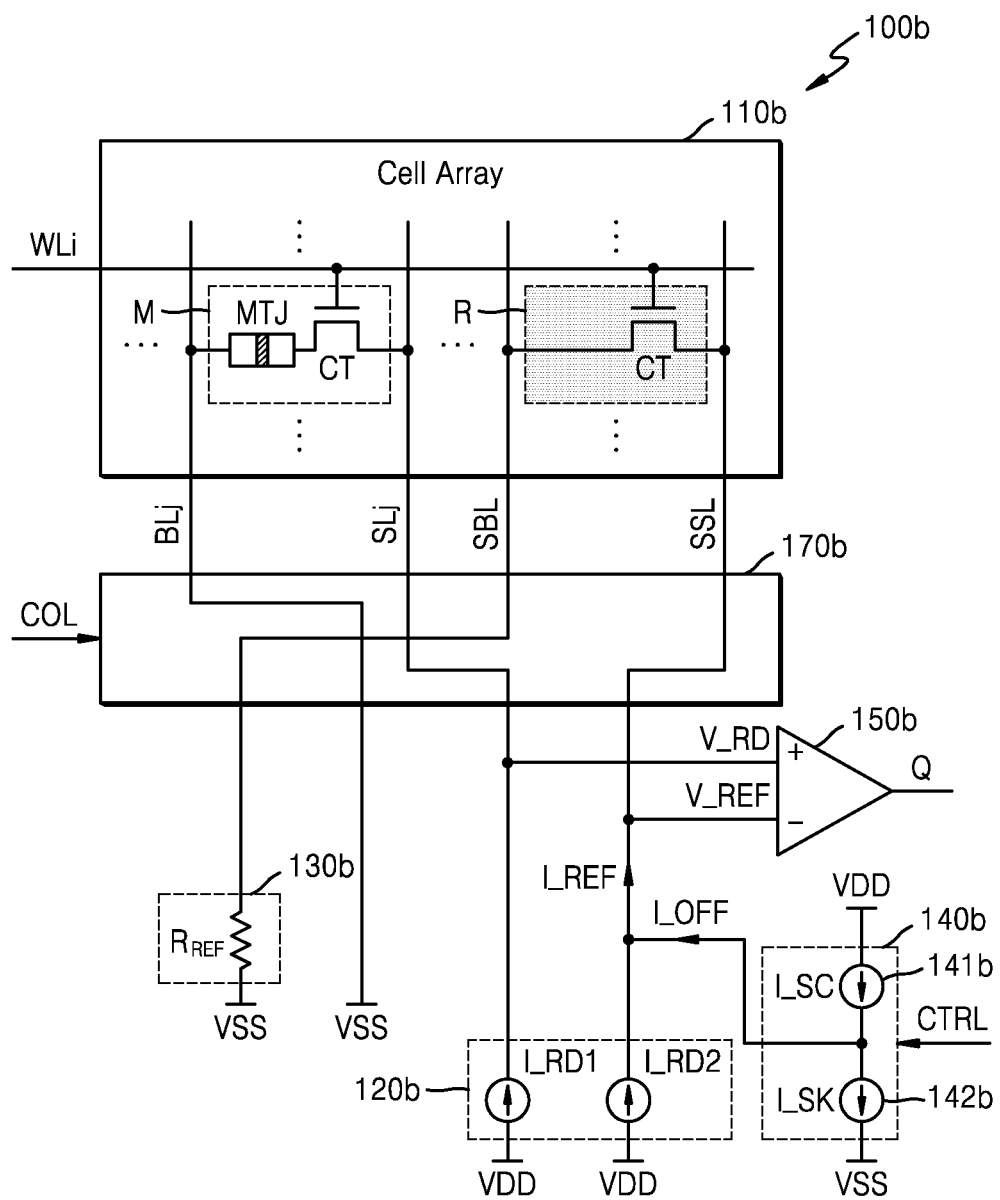
FIG. 5 is a block diagram showing an example of the memory device of FIG. 1 according to an example embodiment.
Figure 6:
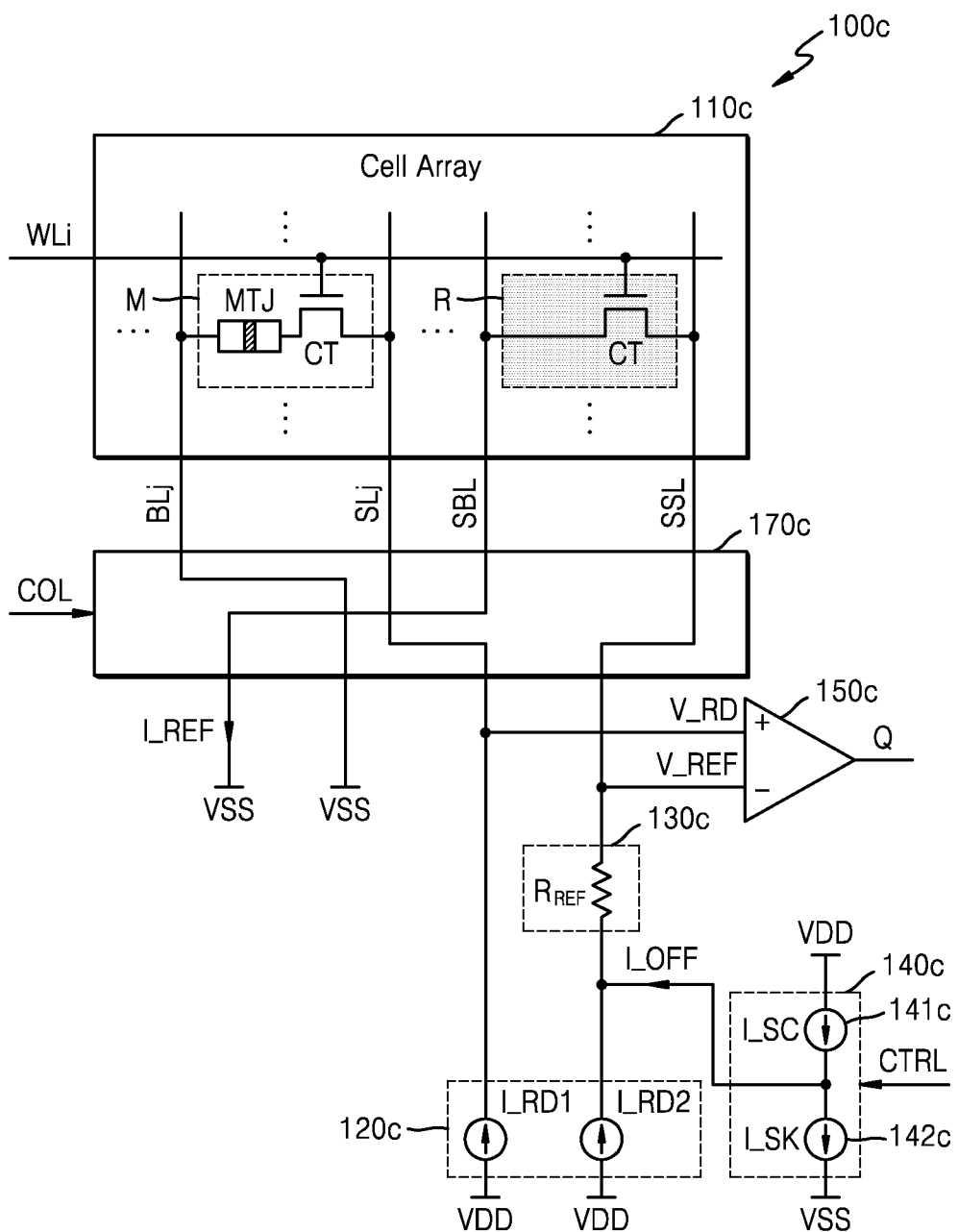
FIG. 6 is a block diagram showing an example of the memory device of FIG. 1 according to an example embodiment.

Hereinafter, referring to FIGS. 4 to 6, examples of the memory device 100 of FIG. 1 in a read operation will be described. In the examples of FIGS. 4 to 6, the offset current I_OFF may have a positive or negative value. In other words, the reference current I_REF may be equal to a sum of the second read current I_RD2 and the offset current I_OFF, as shown in Equation 1 below.

I_REF=I_RD2+I_OFF [Equation 1]

Accordingly, the positive offset current I_OFF may indicate that the reference current I_REF is generated as a current corresponding to the magnitude of the offset current I_OFF is added to the second read current I_RD2 (that is, I_REF>I_RD2). Meanwhile, the negative offset current I_OFF may indicate that the reference current I_REF is generated as a current corresponding to the magnitude of the offset current I_OFF is drawn from the second read current I_RD2 (that is, I_REF<I_RD2). Furthermore, the magnitude of the offset current I_OFF may be zero according to the control signal CTRL.

FIG. 4 is a block diagram showing an example of the memory device 100 of FIG. 1 according to an example embodiment. In detail, FIG. 4 shows a memory device 100a including an offset current circuit 140a between a reference cell R and a reference resistance circuit 130a. As shown in FIG. 4, the memory device 100a may include a cell array 110a, a current source circuit 120a, the reference resistance circuit 130a, the offset current circuit 140a, an amplification circuit 150a, and a column decoder 170a.

The cell array 110a may include the memory cell M and the reference cell R connected in common to the word line WLi. The memory cell M may be connected to the bit line BLj and the source line SLj, and the reference cell R may be connected to a shorting bit line SBL and a shorting source line SSL. The bit line BLj, the source line SLj, the shorting bit line SBL, and the shorting source line SSL may extend to the column decoder 170a. The memory cell M may include the variable resistance element MTJ and the cell transistor CT connected in series between the bit line BLj and the source line SLj, whereas the reference cell R may include the cell transistor CT connected to the shorting bit line SBL and the shorting source line SSL. Therefore, the shorting bit line SBL and the shorting source line SSL may be electrically short-circuited or opened by the cell transistor CT of the reference cell R, and such the reference cell R without a resistor may be referred to as a shorted cell.

To compensate for a voltage drop due to the bit line BLj and the source line SLj connected to the memory cell M, the reference cell R connected to the shorting bit line SBL and the shorting source line SSL may be disposed in the cell array 110a. As shown in FIG. 4, the reference cell R may be a short-circuited cell, and thus, a voltage drop due to the variable resistance element MTJ of the memory cell M may be compared with a voltage drop due to the reference resistance circuit 130a outside the cell array 110a. As being irrelevant to spatial and structural restrictions of the cell array 110a, the reference resistance circuit 130a outside the cell array 110a may provide the reference resistance $R_{REF}$ insensitive to PVT variations or the like, and thus the reference voltage V_REF may be accurately adjusted by the reference current I_REF.

The column decoder 170a may route the bit line BLj, the source line SLj, the shorting bit line SBL, and the shorting source line SSL according to a column address COL. The column address COL may be generated from an address ADDR received from the controller 200 of FIG. 1, and the column decoder 170a may select at least some of memory cells and reference cells, which are selected in the cell array 110a according to an activated word line WLi, according to the column address COL. For example, as shown in FIG. 4, the column decoder 170a may connect the bit line BLj of the memory cell M to a negative supply voltage VSS and connect the source line SLj to the current source circuit 120a. Furthermore, the column decoder 170a may connect the shorting bit line SBL of the reference cell R to a node to which the reference resistance circuit 130a and the offset current circuit 140a are connected and connect the shorting source line SSL to the current source circuit 120a. Therefore, the first read current I_RD1 may flow through the source line SLj, the memory cell M, and the bit line BLj to the negative supply voltage VSS, the second read current I_RD2 may pass through the short circuit source line SSL, the reference cell R, and the short circuit bit line SBL, and the reference current I_REF, which is the sum of the second read current I_RD2 and the offset current I_OFF, may flow through the reference resistance circuit 130a to the negative supply voltage VSS.

The amplification circuit 150a may be connected to nodes to which the first read current I_RD1 and the second read current I_RD2 are output from the current source circuit 120a and generate an output signal Q according to voltages of the nodes, that is, the read voltage V_RD and the reference voltage V_REF. The reference voltage V_REF may be determined based on the resistance value of the variable resistance element MTJ of the memory cell M and the first read current I_RD1, whereas the reference voltage V_REF may be determined based on the reference resistance value $R_{REF}$ and the reference current I_REF. The amplification circuit 150a may generate the output signal Q corresponding to '1' when the read voltage V_RD is higher than the reference voltage V_REF and may generate the output signal Q corresponding to '0' when the read voltage V_RD is lower than the reference voltage V_REF.

The offset current circuit 140a may include a first current source 141a providing a source current I_SC and a second current source 142a providing a sink current I_SK. Therefore, the offset current I_OFF may be equal to a difference between the source current I_SC and the sink current I_SK, as shown in Equation 2 below.

$$I\_OFF = I\_SC - I\_SK \qquad [\text{Equation 2}]$$

The first current source 141a and/or the second current source 142a may adjust the source current I_SC and/or the sink current I_SK according to the control signal CTRL, thereby adjusting the offset current I_OFF. In some example embodiments, the offset current circuit 140a may include only one of the first current source 141a and the second current source 142a, as described below with reference to FIGS. 8B and 8C.

FIG. 5 is a block diagram showing an example of the memory device 100 of FIG. 1 according to an example embodiment. In detail, FIG. 5 shows a memory device 100b including an offset current circuit 140b between a current source circuit 120b and the reference cell R. As shown in FIG. 5, the memory device 100b may include a cell array 110b, the current source circuit 120b, a reference resistance circuit 130b, the offset current circuit 140b, an amplification circuit 150b, and a column decoder 170b. Hereinafter, descriptions identical to the descriptions of FIG. 4 will be omitted.

As the offset current circuit 140b is disposed between the current source circuit 120b and the reference cell R, the reference current I_REF generated as the offset current I_OFF is reflected to the second read current I_RD2 may flow through the shorting source line SSL, the reference cell R, the shorting bit line SBL, and the reference resistance circuit 130b to the negative supply voltage VSS. The offset current circuit 140b may include a first current source 141b providing the source current I_SC and a second current source 142b providing the sink current I_SK, and the offset current I_OFF may be determined as shown in Equation 2. The first current source 141b and/or the second current source 142b may adjust the source current I_SC and/or the sink current I_SK according to the control signal CTRL, thereby adjusting the offset current I_OFF. In some example embodiments, unlike as shown in FIG. 5, the offset current circuit 140b may include only one of the first current source 141b and the second current source 142b.

FIG. 6 is a block diagram showing an example of the memory device 100 of FIG. 1 according to an example embodiment. In detail, FIG. 6 shows a memory device 100c including an offset current circuit 140c between a reference cell R and a reference resistance circuit 130c. Compared to the memory device 100b of FIG. 5, the reference resistance circuit 130c may be disposed between a current source circuit 120c and the reference cell R instead of being disposed between the reference cell R and the negative supply voltage VSS. As shown in FIG. 6, the memory device 100c may include a cell array 110c, the current source circuit 120c, the reference resistance circuit 130c, an offset current circuit 140c, an amplification circuit 150c, and a column decoder 170c. Hereinafter, descriptions identical to the descriptions of FIGS. 4 and 5 will be omitted.

As the offset current circuit 140c is disposed between the current source circuit 120c and the reference resistance circuit 130c, the reference current I_REF generated as the offset current I_OFF is reflected to the second read current I_RD2 may flow through the reference resistance circuit 130c, the shorting source line SSL, the reference cell R, and the shorting bit line SBL to the negative supply voltage VSS. The offset current circuit 140c may include a first current source 141c providing the source current I_SC and a second current source 142c providing the sink current I_SK, and the offset current I_OFF may be determined as shown in Equation 2. The first current source 141c and/or the second current source 142c may adjust the source current I_SC and/or the sink current I_SK according to the control signal CTRL, thereby adjusting the offset current I_OFF. In some example embodiments, unlike as shown in FIG. 6, the offset current circuit 140c may include only one of the first current source 141c and the second current source 142c.

FIGS. 7A to 7D are block diagrams showing examples of the control circuit 160 of FIG. 1 according to example embodiments. As described above with reference to FIG. 1, control circuits 160a, 160b, 160c, and 160d of FIGS. 7A to 7D may each generate the control signal CTRL, and the offset current I_OFF generated by the offset current circuit 140 may be controlled based on the control signal CTRL. Hereinafter, FIGS. 7A to 7D will be described with reference to FIG. 1.

Figure 7A:
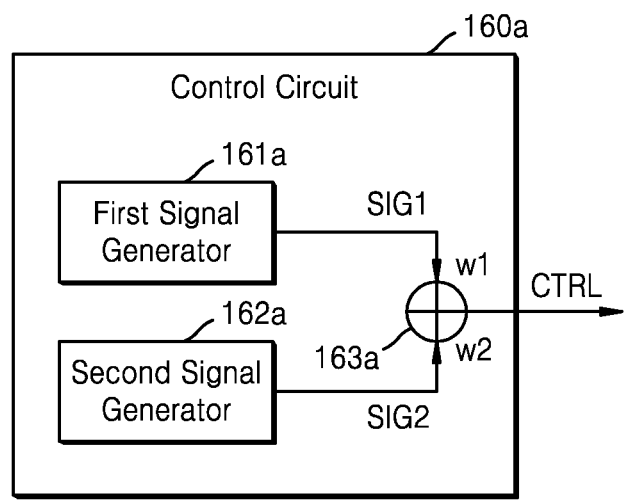
FIGS. 7A to 7D are block diagrams showing examples of a control circuit of FIG. 1 according to example embodiments.

Referring to FIG. 7A, a control circuit 160a may include a first signal generator 161a, a second signal generator 162a, and a combining circuit 163a and may generate the control signal CTRL based on a signal of which the magnitude varies according to a variation of PVT (e.g., a voltage, a current, etc.). In some example embodiments, the first signal generator 161a may generate a first signal SIG1 having a magnitude proportional to temperature, whereas the second signal generator 162a may generate a second signal SIG2 having a magnitude inversely proportional to temperature. In some example embodiments, the first signal generator 161a may generate a first signal SIG1 having a magnitude proportional to a supply voltage, e.g., the positive supply voltage VDD, whereas the second signal generator 162a may generate a second signal SIG2 having a magnitude inversely proportional to the positive supply voltage VDD. The combining circuit 163a may generate the control signal CTRL as a weighted sum of the first signal SIG1 and the second signal SIG2 according to a first weight w1 and a second weight w2. The first weight w1 and the second weight w2 of the combining circuit 163a may be determined according to the variation characteristics of the resistance of the memory cell M.

Figure 7B:
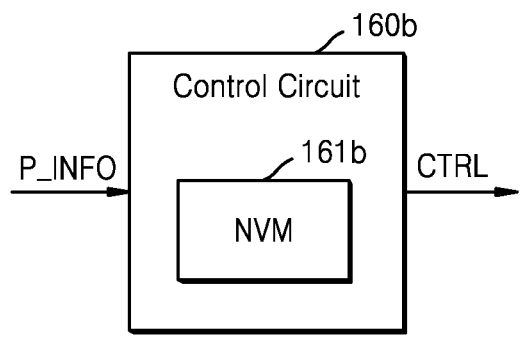

Referring to FIG. 7B, the control circuit 160b may include a non-volatile memory 161b and may receive process information P_INFO. For example, the process information P_INFO may be generated from a process in which the memory device 100 of FIG. 1 is manufactured, and the process information P_INFO may be provided during a process for manufacturing the memory device 100. The control circuit 160b may store the process information P_INFO in the non-volatile memory 161b and may generate the control signal CTRL based on the process information P_INFO stored in the non-volatile memory 161b during an operation for reading the memory device 100. In some example embodiments, the process information P_INFO may include information about the offset current I_OFF and the control circuit 160b may generate the control signal CTRL based on the information about the offset current I_OFF.

Figure 7C:
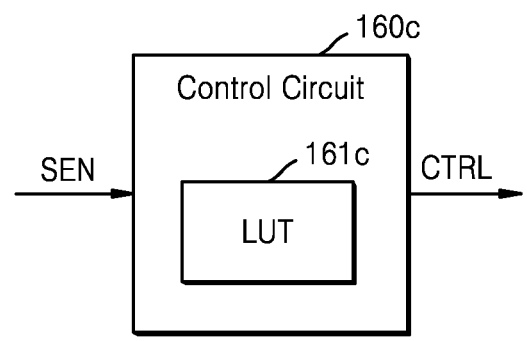

Referring to FIG. 7C, a control circuit 160c may include a look-up table 161c and may receive a sensing signal SEN. The sensing signal SEN is a signal generated by sensing an operating environment of the memory device 100 and may be an analog signal or a digital signal. For example, the sensing signal SEN may be generated as a temperature sensor included in the memory device 100 senses the temperature of the memory device 100 or as a voltage sensor included in the memory device 100 senses a supply voltage provided to the memory device 100. The look-up table 161c may include mapping information about the sensing signal SEN and the control signal CTRL, and thus the control circuit 160c generate the control signal CTRL corresponding to the received sensing signal SEN by referring to the look-up table 161c.

Figure 7D:
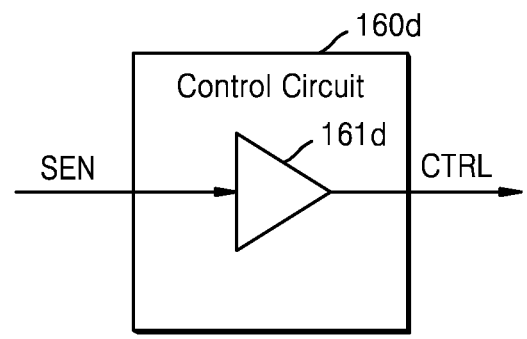

Referring to FIG. 7D, the control circuit 160d may include a signal processing circuit 161d and may receive the sensing signal SEN. As described above with reference to FIG. 7C, the sensing signal SEN may be a signal generated by sensing an operating environment of the memory device 100. In some example embodiments, the sensing signal SEN may be an analog signal and the signal processing circuit 161d may generate the control signal CTRL by amplifying or attenuating the sensing signal SEN. In some example embodiments, the sensing signal SEN may be a digital signal, and the signal processing circuit 161d may generate the control signal CTRL by computing or converting the sensing signal SEN.

Figure 8A:
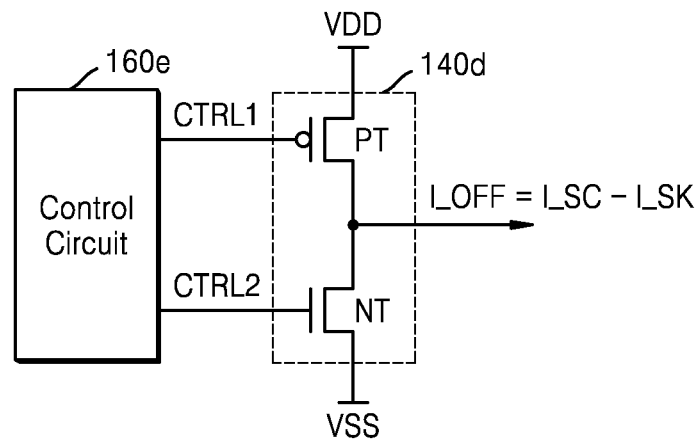
FIGS. 8A, 8B, and 8C are block diagrams showing examples of an offset current circuit of FIG. 1 according to an example embodiment.
Figure 8B:
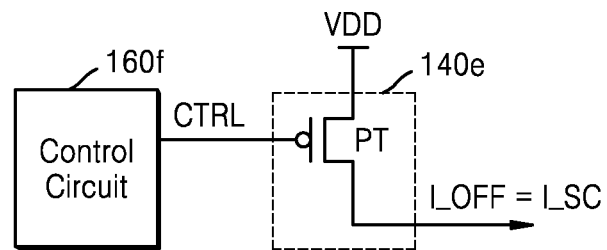
Figure 8C:
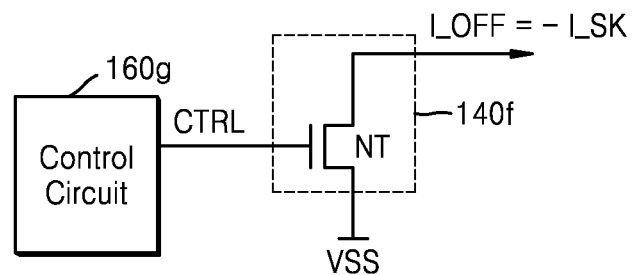

FIGS. 8A, 8B, and 8C are block diagrams showing examples of the offset current circuit 140 of FIG. 1 according to an example embodiment. As described above with reference to FIG. 1, offset current circuits 140d, 140e, and 140f of FIGS. 8A, 8B and 8C may each generate an offset current I_OFF of which the magnitudes are adjusted according to the control signal CTRL. Hereinafter, FIGS. 8A, 8B, and 8C will be described with reference to FIG. 1.

Referring to FIG. 8A, in some example embodiments, the offset current circuit 140d may include two current sources. For example, as shown in FIG. 8A, the offset current circuit 140d may include a PMOS transistor PT for generating the source current I_SC and an NMOS transistor NT for generating the sink current I_SK. The PMOS transistor PT may include a gate for receiving a first control signal CTRL1 from a control circuit 160e, a source connected to the positive supply voltage VDD, and a drain connected to the NMOS transistor NT. Furthermore, the NMOS transistor NT may include a gate for receiving a second control signal CTRL2 from the control circuit 160e, a source connected to the negative supply voltage VSS, and a drain connected to the PMOS transistor PT. The offset current I_OFF may be output through a node to which the drain of the PMOS transistor PT and the drain of the NMOS transistor NT are connected, and thus, as shown in FIG. 8A, the offset current I_OFF may be identical to a difference between the source current I_SC and the sink current I_SK. The control circuit 160e may generate the reference current I_REF that is greater than a positive offset current I_OFF, that is, the second read current I_RD2, based on the first control signal CTRL1 and the second control signal CTRL2 and may also generate a negative offset current I_OFF, that is, the reference current I_REF that is less than the second read current I_RD2.

Referring to FIG. 8B, in some example embodiments, the offset current circuit 140e may include one current source. For example, as shown in FIG. 8B, the offset current circuit 140e may include the PMOS transistor PT for generating the source current I_SC. The PMOS transistor PT may include a gate for receiving the control signal CTRL from a control circuit 160f, a source connected to the positive supply voltage VDD, and a drain that outputs the offset current I_OFF. Therefore, the offset current I_OFF may be identical to the source current I_SC. In some example embodiments, when the variable resistance element included in the memory cell M has a positive temperature coefficient and the reference resistance $R_{REF}$ is configured to have a magnitude suitable for determination of the resistance of the variable resistance element at a low temperature (e.g., room temperature), the control circuit 160f may increase the magnitude of the offset current I_OFF by reducing the voltage of the control signal CTRL as the temperature rises. Therefore, the magnitude of the reference current I_REF may increase at a high temperature and, as a result, the reference voltage V_REF may increase.

Referring to FIG. 8C, in some example embodiments, the offset current circuit 140f may include one current source. For example, as shown in FIG. 8C, the offset current circuit 140f may include the NMOS transistor NT for generating the sink current I_SK. The NMOS transistor NT may have a gate for receiving the control signal CTRL from a control circuit 160g, a source connected to the negative supply voltage VSS, and a drain for outputting the offset current I_OFF. Therefore, the offset current I_OFF may have the same magnitude as the sink current I_SK and may have a direction opposite to that of the sink current I_SK. In some example embodiments, when the variable resistance element included in the memory cell M has a negative temperature coefficient and the reference resistance $R_{REF}$ is configured to have a magnitude suitable for determination of the resistance of the variable resistance element at a low temperature (e.g., room temperature), the control circuit 160g may increase the magnitude of the offset current I_OFF by increasing the voltage of the control signal CTRL as the temperature rises. Therefore, the magnitude of the reference current I_REF may decrease at a high temperature and, as a result, the reference voltage V_REF may decrease.

Figure 9:
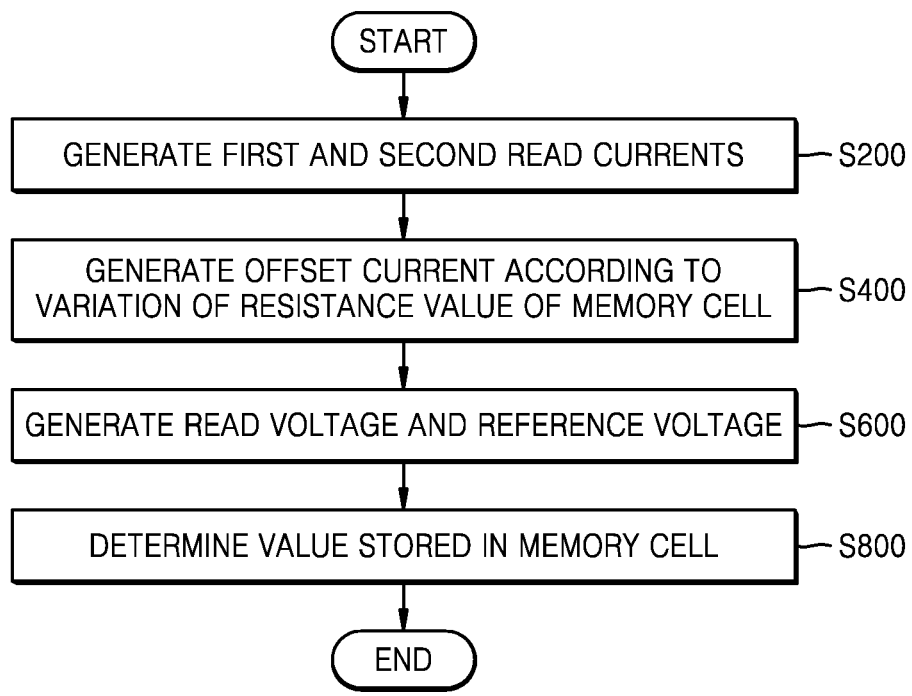
FIG. 9 is a flowchart of a method of operating a memory device, according to an example embodiment.

FIG. 9 is a flowchart of a method of operating a memory device according to an example embodiment. In detail, FIG. 9 shows an example of a read operation of a memory device in response to a read command In some example embodiments, the method of FIG. 9 may be performed by the memory device 100 of FIG. 1, and hereinafter, FIG. 9 will be described with reference to FIG. 1.

In operation S200, an operation of generating a first read current I_RD1 and a second read current I_RD2 may be performed. For example, the current source circuit 120 of the memory device 100 may generate the first read current I_RD1 and the second read current I_RD2 in response to a read command. The first read current I_RD1 may be provided to the memory cell M of the cell array 110 and at least a part of the second read current I_RD2 may be provided to the reference cell R of the cell array 110. In some example embodiments, the first read current I_RD1 and the second read current I_RD2 may have a substantially same magnitude.

In operation S400, an operation for generating the offset current I_OFF according to a variation of the resistance of the memory cell M may be performed. For example, the control signal CTRL may be generated to compensate for the variation of the resistance of the memory cell M based on a process in which the memory device 100 is manufactured, an operating environment (e.g., supply voltage and temperature) of the memory device 100, etc., and the offset current circuit 140 may generate the offset current I_OFF according to the control signal CTRL. The reference current I_REF may be generated by increasing or decreasing the second read current I_RD2 due to the offset current I_OFF.

In operation S600, an operation for generating the read voltage V_RD and the reference voltage V_REF may be performed. For example, as the first read current I_RD1 passes through the memory cell M, the read voltage V_RD may be generated. Furthermore, in some example embodiments, the reference voltage V_REF may be generated as the second read current I_RD2 passes through the reference cell R and the reference current passes through the reference resistance circuit 130. In some example embodiments, the reference voltage V_REF may be generated as the reference current I_REF passes through the reference cell R and the reference resistance circuit 130.

In operation S800, an operation for determining a value stored in the memory cell M may be performed. For example, the amplification circuit 150 may receive the read voltage V_RD and the reference voltage V_REF, compare the read voltage V_RD with the reference voltage V_REF, and generate an output corresponding to the value stored in the memory cell M. As the variation of the resistance of the memory cell M is reflected to the reference voltage V_REF by the offset current I_OFF, the value stored in the memory cell M may be accurately read.

Figure 10:
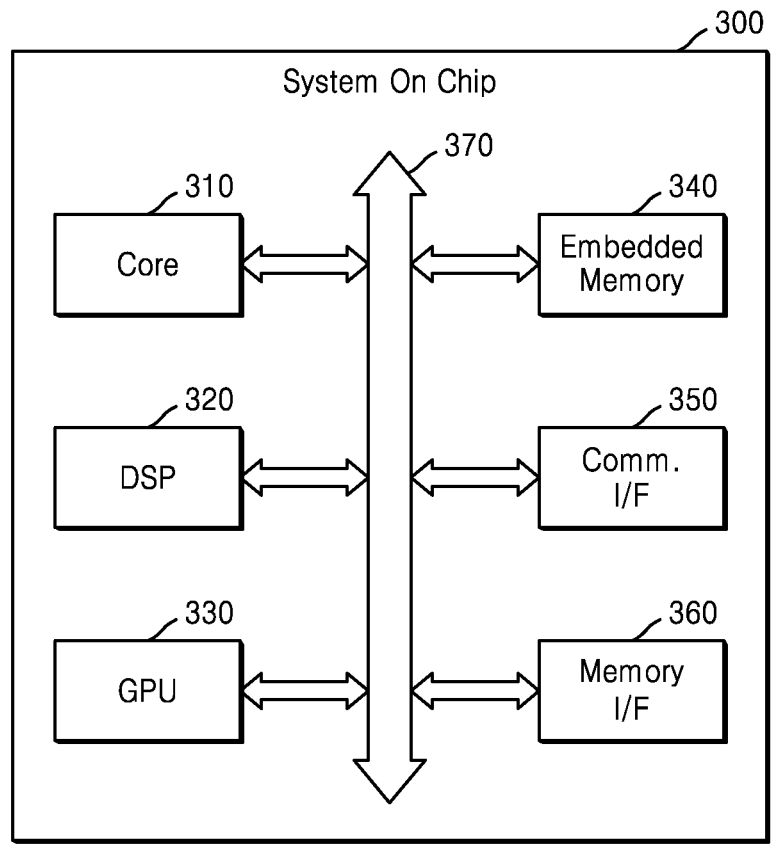
FIG. 10 is a block diagram showing a system-on-chip (SoC) that includes a memory device according to an example embodiment.

FIG. 10 is a block diagram showing a system-on-chip (SoC) 300 that includes a memory device according to an example embodiment. The SoC 300 may refer to an integrated circuit that integrates components of a computing system or other electronic system. For example, as an example of the SoC 300, an application processor (AP) may include a processor and components for other functions. As shown in FIG. 10, the SoC 300 may include a core 310, a digital signal processor (DSP) 320, a graphic processing unit (GPU) 330, an internal memory 340, a communication interface 350, and/or a memory interface 360. The components of SoC 300 may communicate with one another via a bus 370.

The core 310 may process instructions and may control operations of components included in the SoC 300. For example, the core 310 may drive an operating system and execute applications on the operating system by processing a series of instructions. The DSP 320 may generate useful data by processing a digital signal, e.g., a digital signal provided by the communication interface 350. The GPU 330 may generate data for an image to be output via a display device from image data provided by the internal memory 340 or encode image data.

The internal memory 340 may store data for operating the core 310, the DSP 320, and the GPU 330. The internal memory 340 may include a resistive memory device according to an example embodiment, and thus the internal memory 340 may exhibit high operational reliability by compensating for variations of the variable resistive element.

The communication interface 350 may provide a communication network or an interface for one-on-one communication. The memory interface 360 may provide an interface for an external memory of the SoC 300, e.g., a dynamic random access memory (DRAM), a flash memory, etc.

Figure 11:
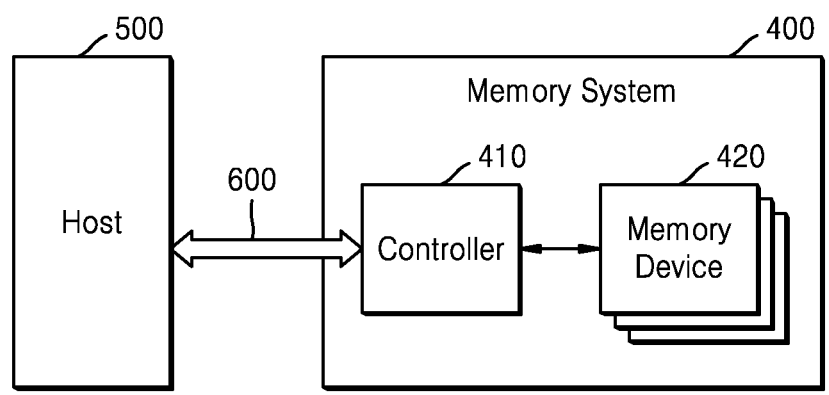
FIG. 11 is a block diagram showing a memory system that includes a memory device according to an example embodiment.

FIG. 11 is a block diagram showing a memory system 400 that includes a memory device according to an example embodiment. As shown in FIG. 11, the memory system 400 may communicate with a host 500 and may include a controller 410 and a memory device 420.

An interface 600 via which the memory system 400 and the host 500 communicate with each other may use electrical signals and/or optical signals and may include, but are not limited to, a serial advanced technology attachment (SATA) interface, a SATA express (SATAe) interface, a serial attached small computer system interface (serial attached SCSI; SAS), a peripheral component interconnect express (PCIe) interface, a non-volatile memory express (NVMe) interface, an advanced host controller interface (AHCI), or a combination thereof.

In some example embodiments, the memory system 400 may communicate with the host 500 by being removably coupled to the host 500. As a resistive memory, the memory device 420 may be a non-volatile memory, and the memory system 400 may be referred to as a storage system. For example, the memory system 400 may include, but is not limited to, a solid-state drive or solid-state disk (SSD), an embedded SSD (eSSD), a multimedia card (MMC), an embedded multimedia card (eMMC), or the like.

The controller 410 may control the memory device 420 in response to a request received from the host 500 via the interface 600. For example, in response to a write request, the controller 410 may write data received in association with the write request to the memory device 420 and, in response to a read request, provide data stored in the memory device 420 to the host 500.

The memory system 400 may include at least one memory device 420 and the memory device 420 may include a reference cell and memory cells having variable resistive elements. As described above with reference example embodiments, a variation of the resistance of a memory cell due to a manufacturing process of the memory device 420 and an operating environment of the memory device 420 or the memory system 400 may be simply and accurately compensated for by adjusting a reference current flowing through a reference resistor connected to a reference cell. Therefore, the memory device 420 may accurately provide a value stored in a memory cell to the controller 410 in response to a read command of the controller 410, thereby improving the operational reliability of the memory system 400.

While the inventive concepts have been particularly shown and described with reference to example embodiments thereof, it will be understood that various changes in form and details may be made therein without departing from the spirit and scope of the following claims.

What is claimed is:

1. A resistive memory device configured to output a value stored in a memory cell in response to a read command, the resistive memory device comprising:
   a cell array including the memory cell and a reference cell;
   a reference resistance circuit electrically connected to the reference cell;
   an offset current source circuit configured to generate an offset current based on a control signal, the offset current being combined with a read current provided to the reference resistance circuit to increase or decrease a magnitude of the read current; and
   a control circuit configured to generate the control signal to control the offset current source circuit to compensate for a variation of a resistance of the memory cell.

2. The resistive memory device of claim 1,
   the control circuit is configured to generate the control signal to adjust a magnitude of the offset current based on a temperature of the resistive memory device.

3. The resistive memory device of claim 2, wherein
   the offset current source circuit is configured to adjust the magnitude of the offset current according to the control signal;

the control circuit is configured to,
  generate a first signal proportional to temperature,
  generate a second signal inversely proportional to temperature, and
  generate the control signal as a weighted sum of the first signal and the second signal; and
a weight of the weighted sum is determined according to temperature variation characteristics of the resistance of the memory cell.

4. The resistive memory device of claim 2, wherein
the offset current source circuit is configured to adjust the magnitude of the offset current according to the control signal;
the control circuit includes a look-up table; and
the control circuit is further configured to generate the control signal from a temperature signal according to the temperature of the resistive memory device by referring to the look-up table.

5. The resistive memory device of claim 1, further comprising:
a non-volatile memory configured to store process information,
wherein the control circuit is configured to generate the control signal to adjust a magnitude of the offset current based on the process information by accessing the non-volatile memory.

6. The resistive memory device of claim 1, wherein the control circuit is configured to generate the control signal to adjust a magnitude of the offset current based on a magnitude of a positive supply voltage of the resistive memory device.

7. A resistive memory device configured to output a value stored in a memory cell in response to a read command, the resistive memory device comprising:
a cell array including the memory cell through which a first read current passes and a reference cell through which a reference current passes;
a current source circuit configured to generate the first read current and a second read current;
an offset current source circuit configured to generate the reference current by outputting an offset current based on a control signal, the offset current being combined with the second read current, the reference current having a magnitude higher or lower than the second read current; and
a control circuit configured to generate the control signal to control the offset current source circuit to compensate for a variation of a resistance of the memory cell.

8. The resistive memory device of claim 7, further comprising:
a reference resistance circuit electrically connected to the reference cell and through which the reference current passes.

9. The resistive memory device of claim 7, wherein
the control circuit is configured to generate the control signal to adjust a magnitude of the offset current based on a temperature of the resistive memory device.

10. The resistive memory device of claim 9, wherein
the offset current source circuit is configured to adjust the magnitude of the offset current according to the control signal;
the control circuit is configured to,
  generate a first signal proportional to temperature,
  generate a second signal inversely proportional to temperature, and
  generate the control signal as a weighted sum of the first signal and the second signal; and
a weight of the weighted sum is determined according to temperature variation characteristics of the resistance of the memory cell.

11. The resistive memory device of claim 9, wherein
the offset current source circuit is configured to adjust the magnitude of the offset current according to the control signal; and
the control circuit includes a look-up table; and
the control circuit is further configured to generate the control signal from a temperature signal according to the temperature of the resistive memory device by referring to the look-up table.

12. The resistive memory device of claim 7, further comprising:
a non-volatile memory configured to store process information,
wherein the control circuit is configured to generate the control signal to adjust a magnitude of the offset current based on the process information by accessing the non-volatile memory.

13. The resistive memory device of claim 7, wherein the control circuit is configured to generate the control signal to adjust a magnitude of the offset current based on a magnitude of a positive supply voltage of the resistive memory device.

14. The resistive memory device of claim 7, wherein the first read current and the second read current are approximately the same.

15. A resistive memory device configured to output a value stored in a memory cell in response to a read command, the resistive memory device comprising:
a cell array including the memory cell through which a first read current passes and a reference cell through which a second read current passes;
an offset current source circuit configured to generate a reference current by outputting an offset current based on a control signal, the offset current being combined with the second read current, the reference current having a magnitude higher or lower than the second read current;
a reference resistance circuit electrically connected to the reference cell and through which the reference current passes; and
a control circuit configured to generate the control signal to control the offset current source circuit to compensate for a variation of a resistance of the memory cell.

16. The resistive memory device of claim 15, wherein
the control circuit is configured to generate the control signal to adjust a magnitude of the offset current based on a temperature of the resistive memory device.

17. The resistive memory device of claim 16, wherein
the offset current source circuit is configured to adjust the magnitude of the offset current according to the control signal;
the control circuit is configured to,
  generate a first signal proportional to temperature,
  generate a second signal inversely proportional to temperature, and
  generate the control signal as a weighted sum of the first signal and the second signal; and
a weight of the weighted sum is determined according to temperature variation characteristics of the resistance of the memory cell.

18. The resistive memory device of claim 16, wherein
the offset current source circuit is configured to adjust the magnitude of the offset current according to the control signal;

the control circuit includes a look-up table; and the control circuit is configured to generate the control signal from a temperature signal according to the temperature of the resistive memory device by referring to the look-up table.

19. The resistive memory device of claim 15, further comprising:

a non-volatile memory configured to store process information, wherein the control circuit is configured to generate the control signal to adjust a magnitude of the offset current based on the process information by accessing the non-volatile memory.

20. The resistive memory device of claim 15, wherein the control circuit is configured to generate the control signal to adjust a magnitude of the offset current based on a magnitude of a positive supply voltage of the resistive memory device.

* * * * *